US012687560B2

(12) United States Patent
Heikkilä et al.

(10) Patent No.: US 12,687,560 B2
(45) Date of Patent: Jul. 21, 2026

(54) METHOD FOR EVALUATING SENSOR DATA, COMPUTING UNIT FOR EVALUATING SENSOR DATA AND SENSOR SYSTEM

(71) Applicant: Robert Bosch GmbH, Stuttgart (DE)

(72) Inventors: Timo Heikkilä, Kusterdingen (DE); Rui Zhang, Wannweil (DE)

(73) Assignee: ROBERT BOSCH GMBH, Stuttgart (DE)

( * ) Notice: Subject to any disclaimer, the term of this patent is extended or adjusted under 35 U.S.C. 154(b) by 511 days.

(21) Appl. No.: 18/323,969

(22) Filed: May 25, 2023

(65) Prior Publication Data

US 2023/0384341 A1     Nov. 30, 2023

(30) Foreign Application Priority Data

May 31, 2022    (DE) ..................... 10 2022 205 457.1

(51) Int. Cl.
*G01P 7/00*        (2006.01)
*H03H 17/02*       (2006.01)

(52) U.S. Cl.
CPC .......... *G01P 7/00* (2013.01); *H03H 17/0202* (2013.01); *H03H 2017/0205* (2013.01)

(58) Field of Classification Search
CPC .................. G01P 7/00; H03H 17/0202; H03H 2017/0205
See application file for complete search history.

(56) References Cited

U.S. PATENT DOCUMENTS

| | | | |
|---|---|---|---|
| 6,801,872 B2 * | 10/2004 | Normann | B60T 8/172 |
| | | | 324/160 |
| 10,780,855 B2 * | 9/2020 | Mayer | H04W 4/48 |
| 2020/0355830 A1 * | 11/2020 | Missbach | G08G 1/166 |

FOREIGN PATENT DOCUMENTS

| | | | | |
|---|---|---|---|---|
| DE | 102013218043 A1 | 3/2015 | | |
| DE | 102014212703 A1 | 1/2016 | | |
| DE | 102017218487 A1 | 4/2019 | | |
| DE | 102021133387 B3 | 11/2022 | | |
| EP | 0638877 A2 * | 2/1995 | ............... | G01P 7/00 |

\* cited by examiner

*Primary Examiner* — Elias Desta
(74) *Attorney, Agent, or Firm* — NORTON ROSE FULBRIGHT US LLP

(57) ABSTRACT

A method for evaluating sensor data. In the method, firstly, raw sensor data and/or processed sensor data from at least one sensor are input and measurement data determined from the raw sensor data and/or the processed sensor data. The measurement data are then corrected on the basis of a mathematical model, wherein, on correction, drift of the raw sensor data and/or of the processed sensor data is determined and removed from the measurement data. The corrected measurement data are furthermore output.

9 Claims, 4 Drawing Sheets

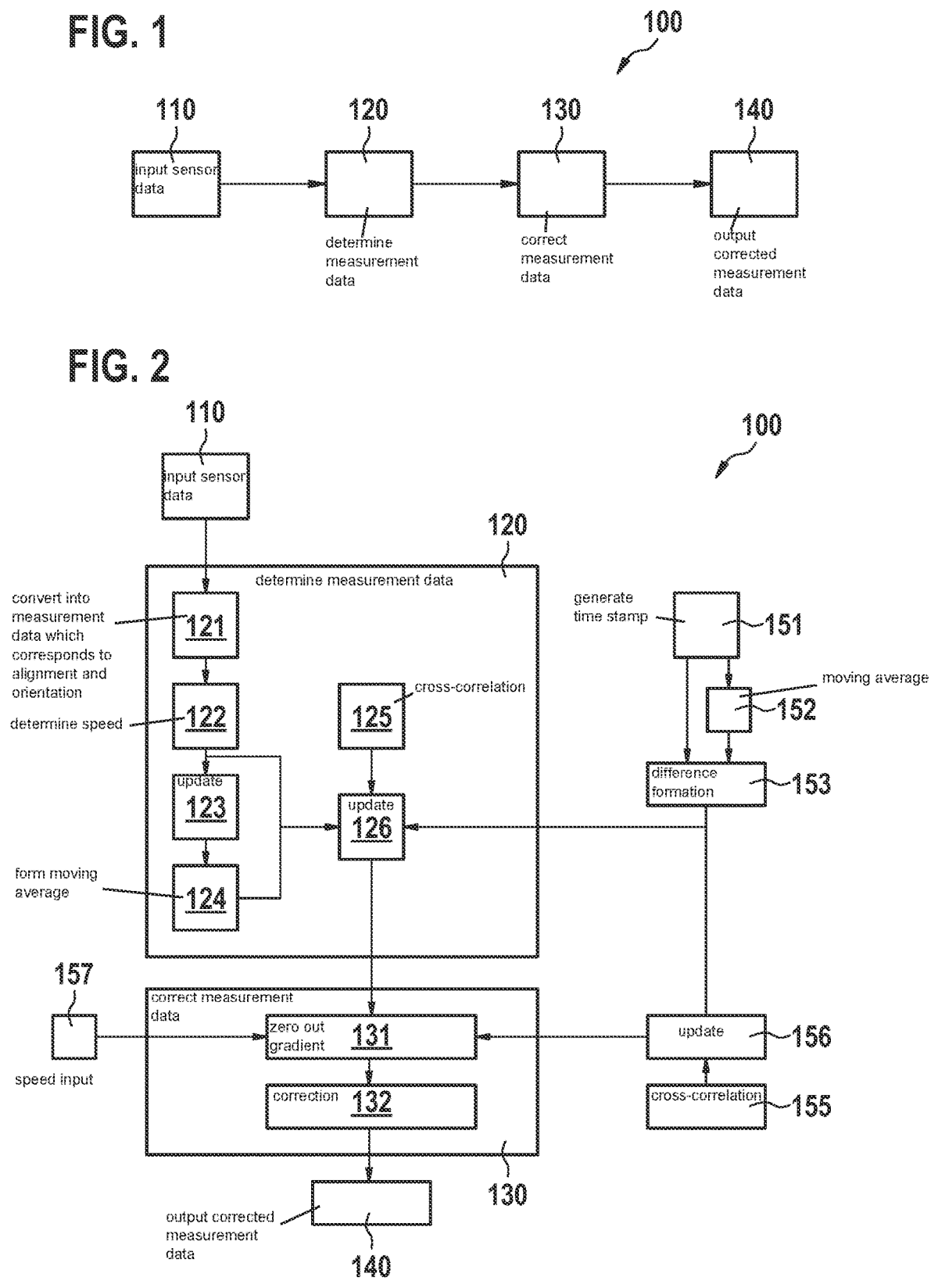

110
input sensor data 120
determine measurement data 130
correct measurement data 140
output corrected measurement data

FIG. 2

110
input sensor data

100

120
determine measurement data convert into measurement data which corresponds to alignment and orientation
121 determine speed
122 update
123 form moving average
124 cross-correlation
125 update
126 generate time stamp
151 moving average
152 difference formation
153

157
speed input 130
correct measurement data
zero out gradient
131 correction
132 update
156 cross-correlation
155

140
output corrected measurement data

METHOD FOR EVALUATING SENSOR DATA, COMPUTING UNIT FOR EVALUATING SENSOR DATA AND SENSOR SYSTEM

CROSS REFERENCE

The present application claims the benefit under 35 U.S.C. 119 of German Patent Application No. DE 10 2022 205 457.1 filed on May 31, 2022, which is expressly incorporated herein by reference in its entirety.

FIELD

The present invention relates to a method for evaluating sensor data, to a computing unit designed to carry out the method and to a sensor system.

BACKGROUND INFORMATION

In some conventional methods, raw sensor data are converted into corrected measurement data. The corrected measurement data are generated using a mathematical model in which measurement data generated from the raw sensor data are processed. The mathematical model may here in particular comprise a filter such as for example a Kalman filter. Such a method may in particular be used for evaluating acceleration sensor data and yaw rate sensor data. Sensors usable in further configurations comprise magnetic field sensors, sensors for satellite positioning systems such as for example GPS and/or Galileo, pressure sensors, cameras, radar or lidar sensors.

SUMMARY

Object of the present invention including providing an improved method for evaluating sensor data, a computing unit for carrying out the method, and an improved sensor system.

These objects may be achieved by the present invention. Advantageous further developments of the present invention are disclosed herein.

The present invention relates to a method for evaluating sensor data. According to an example embodiment of the present invention, in the method, firstly raw sensor data and/or processed sensor data from at least one sensor are input and measurement data determined from the raw sensor data and/or the processed sensor data. The measurement data are then corrected on the basis of a mathematical model, wherein, on correction, drift of the raw sensor data and/or of the processed sensor data is determined and removed from the measurement data. The corrected measurement data are furthermore output.

It may be that the drift of the raw sensor data and/or of the processed sensor data is caused or magnified in that a sensor error gains ever greater influence on integration of the sensor data or in that an incorrect initial value (e.g. an orientation which is estimated using an erroneous measurement of an acceleration sensor) likewise results in an incorrect sensor value due to movement in a region with a predetermined radius or a change in location. The raw sensor data and/or the processed sensor data may here have been generated using one or more sensors, wherein the sensors may comprise magnetic field sensors, sensors for satellite positioning systems such as for example GPS and/or Galileo, pressure sensors, cameras, radar or lidar sensors. The sensors may furthermore comprise acceleration sensors and/or yaw rate sensors. An acceleration sensor and a gyroscope may, for example, be used as sensors. The raw sensor data and/or the processed sensor data may either be output as an analog signal, for example in the form of a voltage, or already have been converted into a digital signal in the sensors using electronics and A/D converters. The processed sensor data may be configured such that, using the sensor, a first variable is determined and a second variable is calculated from the first variable. For example, raw sensor data from an acceleration sensor (acceleration data) can be processed to yield speed data by integrating the acceleration data and so determining speeds. Processing of the raw sensor data may here proceed within the sensor. Processing of the raw sensor data may furthermore also proceed in a computing unit which carries out the method. In particular in the case of processed sensor data, small measurement errors or deviations in the raw sensor data due to the processing, in particular due to integration, may lead to large deviations or major drift of the processed sensor data. The method according to the present invention permits a considerable reduction in this drift.

The present invention furthermore comprises a computing unit having an input, an output, and a processor. According to an example embodiment of the present invention, the computing unit is designed to receive raw sensor data and/or processed sensor data via the input, then to carry out the method according to the present invention using the processor and thereupon to output the corrected measurement data via the output. The computing unit may here be designed to generate processed sensor data from the raw sensor data. For example, raw sensor data from an acceleration sensor (acceleration data) can be processed by the computing unit to yield speed data by integrating the acceleration data and so determining speeds.

The present invention furthermore comprises a sensor system with a computing unit according to the present invention and a sensor. According to an example embodiment of the present invention, the sensor is designed to convert a physical measured variable into raw sensor data and/or processed sensor data and to output them to the input of the computing unit. In particular, the sensor system may also comprise a plurality of sensors, the raw sensor data and/or processed sensor data of which are output to the input of the computing unit. The sensor system may, for example, comprise an acceleration sensor and a gyroscope. In particular, it may be provided that the sensor or the sensors together with the computing unit are accommodated within a component, for example within an ASIC. The sensor may here be designed to generate processed sensor data from the raw sensor data. For example, raw sensor data from an acceleration sensor (acceleration data) can be processed to yield speed data by integrating the acceleration data and so determining speeds.

Determining and removing the drift of the raw sensor data and/or of the processed sensor data means that it is possible to output significantly more accurate measurement data than using conventional methods from the related art. The measuring accuracy of the sensor system is distinctly improved in this way. If an acceleration sensor and a gyroscope are used as the sensors, it is possible as a result to achieve a level of measuring accuracy which has not hitherto been possible without further information or without further sensor data.

In one example embodiment of the method of the present invention, a speed of movement of the sensor is determined from the raw sensor data and/or the processed sensor data. This may, for example, take place if an acceleration sensor and a gyroscope are used as the sensors, since the measurement data determined using an acceleration sensor and gyroscope enable speed determination. This may furthermore also be provided for example for sensors for a satellite positioning system. In other configurations, provision may alternatively or additionally be made for a speed of movement of the sensor to be provided via further information or using further sensors. For example, in the case of a radar or lidar sensor used in a vehicle, a speed of the vehicle and thus also of the radar or lidar sensor could be provided via a vehicle control unit.

In one embodiment of the method of the present invention, the speed of movement of the sensor may be corrected on correction of the measurement data by a speed gradient being set to zero. This may in particular be provided if the sensor is to be used to determine movements of a person or an animal or indeed a robot. When people or animals start to move, it can be assumed after a relatively short time that the movement will proceed at a constant speed, such that there is no longer any change in speed. Provision may be made in a further configuration for it to be determined, using the raw sensor data and/or the processed sensor data, from what point in time the speed no longer changes.

In one embodiment of the method of the present invention, a change in the speed of the sensor is negated if the sensor does not change its location or if the change in speed comprises a movement with a predetermined maximum radius of a few centimeters up to one meter and the sensor is only moving, in particular periodically or randomly, within the range defined by these indications. This may likewise proceed by the speed gradient being set to zero. This also enables mathematically simple implementation.

In one embodiment of the method of the present invention, the speed gradient is calculated as the quotient of a first cross-correlation of the speed of movement of the sensor and a time, and a second cross-correlation of time with itself. This enables simple mathematical implementation of correction of the speed of movement of the sensor.

In one embodiment of the method of the present invention, the mathematical model comprises a probabilistic filter. The filter may be configured as an H-infinity filter, a sequential Monte Carlo filter (SMC filter) or as a Kalman filter. The Kalman filter may, for example, be configured as a nonlinear Kalman filter, i.e. inter alia as an extended Kalman filter or as a Cubature Kalman filter, in particular as a square-root Cubature Kalman filter.

In one embodiment of the method of the present invention, the first cross-correlation is a state of the probabilistic filter. This likewise enables a simple mathematical implementation of the probabilistic filter and of the calculations to be taken into account by correcting the speed of movement of the sensor.

In one embodiment of the method of the present invention, the measurement data is corrected either when a check of a change in a sensor alignment reveals that the sensor alignment has changed or when a check of an intensity of a sensor movement reveals that the intensity of the sensor movement exceeds a predetermined value. These two conditions have proved well suited to confirming that the currently prevailing movement has a characteristic suitable for applying the method. This is in particular the case when the measurement data are corrected by the first cross-correlation being a state of a probabilistic filter, in particular of a Kalman filter.

In one embodiment of the method of the present invention, the raw sensor data and/or the processed sensor data are additionally checked as to whether a temporally persistent acceleration of the movement of the sensor is present. The measurement data are corrected if no temporally persistent acceleration of the movement of the sensor is present.

Exemplary embodiments of the present invention are explained with reference to the figures.

BRIEF DESCRIPTION OF THE DRAWINGS

FIG. 1 shows a flowchart of the method according to an example embodiment of the present invention.

FIG. 2 shows a further flowchart of the method according to an example embodiment of the present invention.

DETAILED DESCRIPTION OF EXAMPLE EMBODIMENTS

Figure 3:
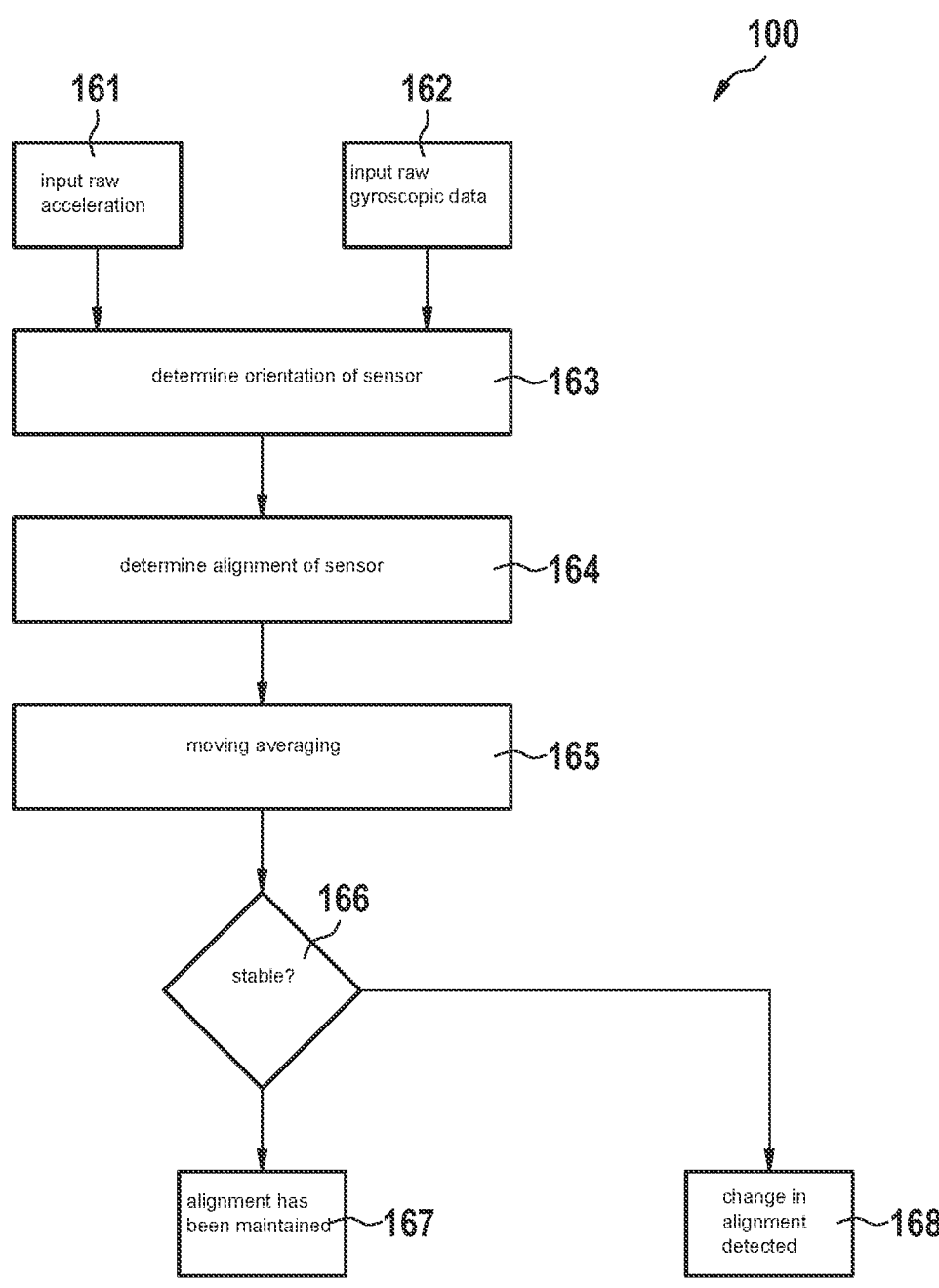
FIG. 3 shows a flowchart of a check of a change in sensor position according to an example embodiment of the present invention.

FIG. 1 shows a flowchart 100 of a method for evaluating sensor data. In a first method step 110, raw sensor data and/or processed sensor data from at least one sensor are input. In a second method step 120, measurement data are determined from the raw sensor data and/or the processed sensor data. In a third method step 130, the measurement data are corrected on the basis of a mathematical model. Drift of the raw sensor data and/or of the processed sensor data is here determined and removed from the measurement data. In a fourth method step 140, the corrected measurement data are output.

The raw sensor data and/or the processed sensor data may here have been generated using one or more sensors, wherein the sensors may comprise magnetic field sensors, sensors for satellite positioning systems such as for example GPS and/or Galileo, pressure sensors, cameras, radar or lidar sensors. The sensors may furthermore comprise acceleration sensors and/or yaw rate sensors. An acceleration sensor and a gyroscope may, for example, be used as sensors. The raw sensor data may be output either as an analog signal, for example in the form of a voltage, or already have been converted into a digital signal in the sensors using electronics and A/D converters. In the first method step 110, the raw sensor data are thus input either as an analog or as a digital signal. The processed sensor data may be configured such that, using the sensor, a first variable is determined and a second variable is calculated from the first variable. For example, raw sensor data from an acceleration sensor (acceleration data) can be processed to yield speed data by integrating the acceleration data and so determining speeds. Processing of the raw sensor data may here proceed within the sensor. Processing of the raw sensor data may furthermore also proceed in a computing unit which carries out the method. In particular in the case of processed sensor data, small measurement errors or deviations in the raw sensor data due to the processing, in particular due to integration, may lead to large deviations or major drift of the processed sensor data. The method according to the present invention permits a considerable reduction in this drift.

In one exemplary embodiment of the present invention, a speed of movement of the sensor is determined from the raw sensor data and/or the processed sensor data. This may in particular be part of the second step 120. In alternative exemplary embodiments, the speed of movement of the sensor can be provided independently of the determination of the measurement data from the raw sensor data and/or the processed sensor data, for example by speed information being input in the second method step 120 or in the third method step 130.

In one exemplary embodiment of the present invention, the speed of movement of the sensor is corrected on correction of the measurement data by a speed gradient being set to zero. Provision may here in particular be made for a moving average of speed or a filtered speed to be used in order to disregard relatively small peaks in speed and/or periodic changes in speed. The speed gradient may here in particular be calculated using formula $$s_v = \frac{n \cdot \sum_{i=1}^{n} v_i \cdot t_i - \sum_{i=1}^{n} t_i \cdot \sum_{i=1}^{n} v_i}{n \cdot \sum_{i=1}^{n} t_i^2 - \left(\sum_{i=1}^{n} t_i\right)^2}.$$

v is here the actual speed, t is the associated averaged or filtered time and n indicates the number of data points in question. This equation can then be rewritten as $$s_v = \frac{\left(n \cdot \sum_{i=1}^{n} v_i \cdot t_i - \sum_{i=1}^{n} t_i \cdot \sum_{i=1}^{n} v_i\right) \cdot \frac{1}{n^2}}{\left(n \cdot \sum_{i=1}^{n} t_i^2 - \left(\sum_{i=1}^{n} t_i\right)^2\right) \cdot \frac{1}{n^2}}$$

or described using formula $$s_v = \frac{\frac{1}{n} \cdot \left(\sum_{i=1}^{n} v_i \cdot t_i\right) - \frac{1}{n} \cdot \left(\sum_{i=1}^{n} t_i\right) \cdot \frac{1}{n} \cdot \left(\sum_{i=1}^{n} v_i\right)}{\frac{1}{n} \cdot \left(\sum_{i=1}^{n} t_{i^2}\right) - \left(\frac{1}{n} \cdot \sum_{i=1}^{n} t_i\right)^2}.$$

This equation can alternatively be written as $$s_v = \frac{E[v \cdot t] - E[v] \cdot E[t]}{E[t \cdot t] - E[t] \cdot E[t]}.$$

In one exemplary embodiment of the present invention, the speed gradient is calculated as the quotient of a first cross-correlation of the speed of movement of the sensor and a time, and a second cross-correlation of time with itself. To this end, the equation may be transformed into the representation $$s_v = \frac{\text{cov}(v \cdot t)}{\text{cov}(t \cdot t)}.$$

The first cross-correlation cov (vt) is here the cross-correlation of the speed of movement of the sensor and a time. The second cross-correlation cov (tt) is a cross-correlation of time with itself and may also be designated an autocorrelation of time with itself.

In one exemplary embodiment of the present invention, the mathematical model comprises a filter, in particular a Kalman filter. The first cross-correlation cov (vt) may here be a state of the filter. The value of the first cross-correlation may here be calculated for each iteration of the filter using the equations $$\bar{v}_{k+1} = (1-\alpha) \cdot \bar{v}_k + \alpha \cdot v_k$$

$$\text{cov}(v \cdot t)_{k+1} = (1-\alpha) \cdot \text{cov}(v \cdot t)_k + \alpha \cdot \Delta t_{k+1} \cdot (v_{k+1} - \bar{v}_{k+1}).$$

$v_k$ is here the speed of the sensor, determined in real terms or provided using information, at the $k^{th}$ iteration step, $v_{k+1}$ is a prediction of speed and $\bar{v}_k$ an estimate of the weighted average speed. The time difference can be calculated using the formula $$\Delta t_{k+1} = t_{real,k+1} - t_{average,k},$$

wherein $t_{average, k}$ is the moving average of time $t_{real}$ in real terms.

Once the time update has been calculated, the measured values can be updated in the filter. The autocorrelation of time may here be calculated outside the filter and $$s_v = \frac{\text{cov}(v \cdot t)}{\text{cov}(t \cdot t)} = 0$$

used as a constraint. This corresponds to a speed gradient of zero. If all sensor errors and a sensor orientation are likewise part of the filter states, these are likewise correspondingly adjusted by the gradient being zeroed, such that the orientation and sensor errors can be better estimated, as a result of which the accuracy of the measurement data increases.

FIG. 2 shows a flowchart 100 of a corresponding filter method. In comparison with the flowchart 100 of FIG. 1, in this chart especially the second method step 120 and the third method step 130 include substeps. Further substeps outside the second method step 120 and the third method step 130 are furthermore shown. The substeps are explained below for an exemplary embodiment of the method in which gyroscope data and acceleration sensor data are used as the sensor data, but the method is in principle also performable for other sensors.

In the first method step 110, raw sensor data from the gyroscope and the acceleration sensor are input. In the second method step 120, these are firstly converted in an inertial navigation step 121 into measurement data which correspond to an alignment and an orientation of the sensor. In a speed determination step 122, a speed of the sensor is furthermore determined from the measurement data. A first update step 123 with the determined sensor data then proceeds and, in a first averaging 124, a moving average of the sensor data is formed.

Outside the second method step 120, a time stamp 151 is generated in parallel, in a second averaging 152 a moving average of the time stamp is generated and, in a difference formation step 153, the above-explained time difference is formed.

The time difference, the result of the speed determination step 122 and the first averaging 124 and a result of a first cross-correlation 125 are processed in a second update step 126. The first cross-correlation 125 here corresponds to the determination of cov (vt) which has already been explained above. The measurement data generated in the second update step 126 then constitute the result of the second step 120.

In the third method step 130, the gradient is zeroed 131 as already explained further above. As already explained further above, a time difference from the difference formation step 153 together with a second cross-correlation 155 may be calculated in a third update step 156 as an input for zeroing 131 outside the third step 130. In particular, the second cross-correlation 155 may comprise an autocorrelation of time.

After zeroing 131, a correction step 132 proceeds, in which in particular speed, orientation and alignment of the sensor are corrected and corrected sensor data consequently generated. This proceeds since sensor errors (which optionally correspond to filter states) are corrected. The corrected sensor data are then output in the fourth method step 140.

FIG. 2 shows an optional speed input step 157. In this step, in addition to the speed of the sensor determined from the raw sensor data, it is possible to input a sensor speed, for example via a satellite navigation signal or as a signal from a vehicle control unit.

The method explained in connection with FIGS. 1 and 2 need not necessarily always be applied or there may be situations in which application makes no sense. It may therefore be provided that the method is only used when specific conditions are present.

In one exemplary embodiment of the method, the measurement data are corrected either when a check of a change in a sensor alignment reveals that the sensor alignment has changed or when a check of an intensity of a sensor movement reveals that the intensity of the sensor movement exceeds a predetermined value.

FIG. 3 shows a flowchart 100 of a check of a change in a sensor alignment. In a first input step 161, raw acceleration data are input. In a second input step 162, raw gyroscope data are input. In an orientation determination step 163, the raw acceleration data and the raw gyroscope data are used to determine an orientation of the sensor, on the basis of which an alignment of the sensor is determined in an alignment determination step 164. These are then processed in a moving averaging 165 and supplied to a checking step 166. The moving averaging 165 may here comprise a time window of a few seconds. Another low-pass filter can also be provided instead of the moving averaging 165. If the checking step 166 reveals that a statistic of the orientation or alignment is stable, it can be assumed that alignment has been maintained 167. If the checking step 166 reveals that a statistic of the orientation or alignment is not stable, it can be assumed that a change in alignment has been detected 168. In the latter case, the method according to FIGS. 1 and 2 can then follow.

Figure 4:
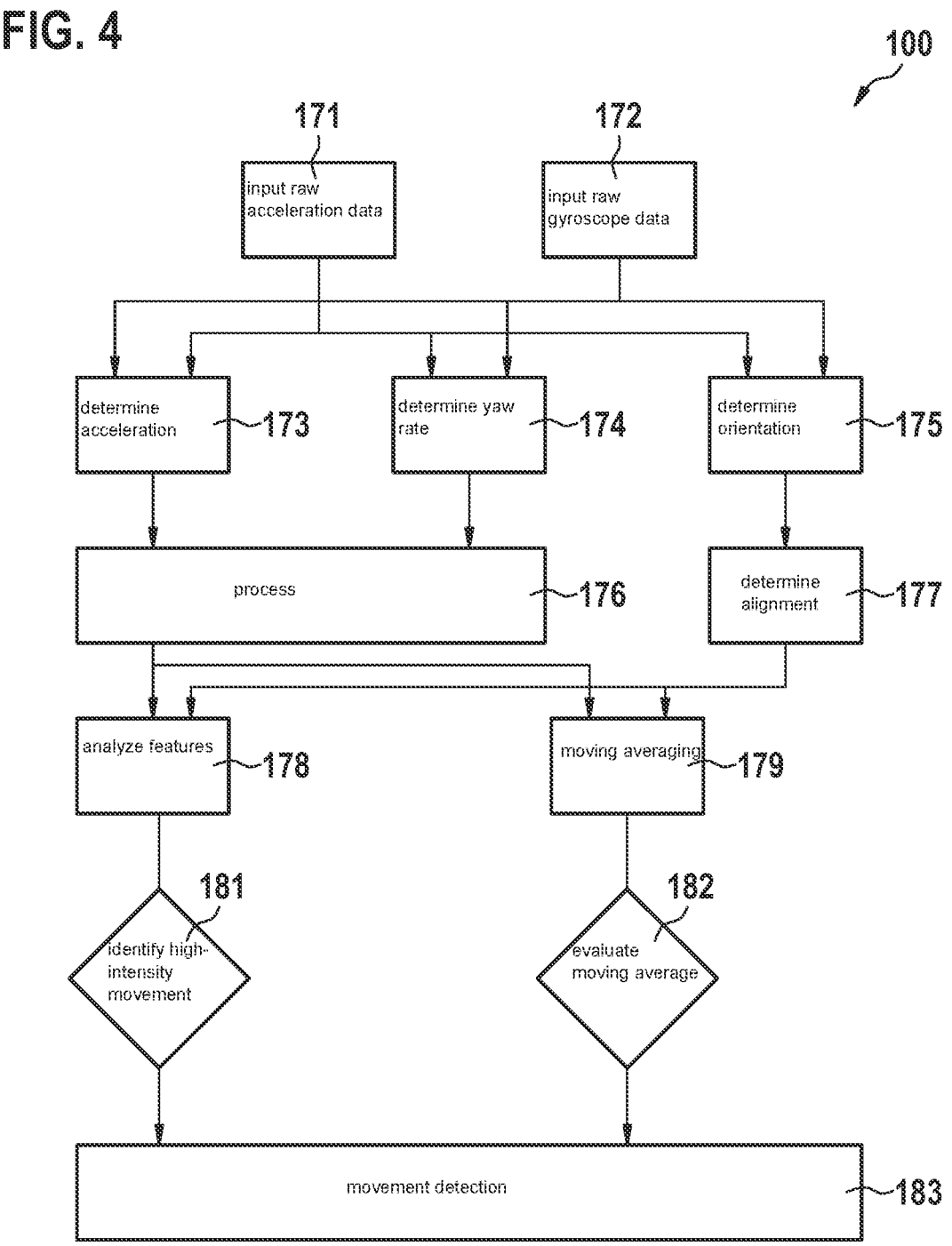
FIG. 4 shows a flowchart of a check of a movement intensity according to an example embodiment of the present invention.

FIG. 4 shows a flowchart 100 of a check of an intensity of sensor movement. In a first input step 171, raw acceleration data are input. In a second input step 172, raw gyroscope data are input. Using these input raw sensor data, an acceleration determination 173, a yaw rate determination 174 and an orientation determination 175 are carried out. The values obtained in the acceleration determination 173 and the yaw rate determination 174 are further processed in a processing step 176. Using the values determined in the orientation determination 175, an alignment determination step 177 is carried out, in which in particular an alignment of the sensor can be determined. On the one hand, further processing may then proceed in an analysis of features 178 and in moving averaging 179. The moving averaging 179 may here comprise a time window of less than one second. Another low-pass filter can also be provided instead of the moving averaging 179. Using the analysis of features 178, it is possible to identify movement features such as for example periodic movements and to determine features of the periodic movement such as excursion, spacing of the maxima, peak height, peak width, main frequency or the like. These can then be filtered out. In a first checking step 181 it is then possible, on the basis of these identified and optionally filtered-out features, to effect a first identification of a high-intensity movement. In a second checking step 182, the moving average from the moving averaging 179 can be evaluated and for example a standard deviation of the movement, a movement range or a change in orientation can be evaluated and likewise a high-intensity movement can be identified in the presence of corresponding criteria. The moving average (or another kind of low pass) in this way makes it possible to take account of in particular enduring changes in the alignment of the sensor. If a corresponding detection is made in the first checking step 181 or in the second checking step 182, movement detection 183 may thus proceed. In this case, the method according to FIGS. 1 and 2 can then likewise follow.

In one exemplary embodiment, the raw sensor data and/or the processed sensor data are further checked as to whether an acceleration of the movement of the sensor is present. The measurement data are corrected if no significant acceleration of the movement of the sensor is present. Significant acceleration of the sensor means in this connection that the acceleration is sufficiently large to change an average speed of the sensor.

Figure 5:
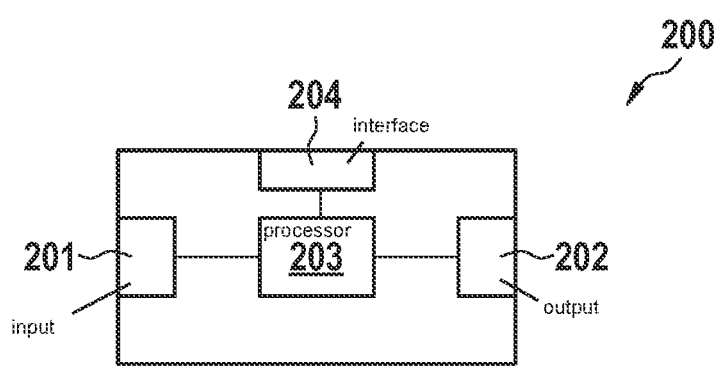
FIG. 5 shows a computing unit according to an example embodiment of the present invention.

FIG. 5 shows a computing unit 200 having an input 201, an output 202 and a processor 203. The computing unit 200 is designed to receive raw sensor data and/or processed sensor data via the input 201, then to carry out the method according to the present invention and described in connection with FIGS. 1 to 4 using the processor 203 and thereupon to output the corrected measurement data via the output 202. An optional further interface 204 is furthermore shown, by way of which for example a speed of the sensor can be received, if the raw sensor data received via the input 201 and/or the processed sensor data do not permit any statement to be made regarding a speed of the sensor. The computing unit 200 may here be designed to generate processed sensor data from the raw sensor data. For example, raw sensor data from an acceleration sensor (acceleration data) can be processed by the computing unit 210 to yield speed data by integrating the acceleration data and so determining speeds.

Figure 6:
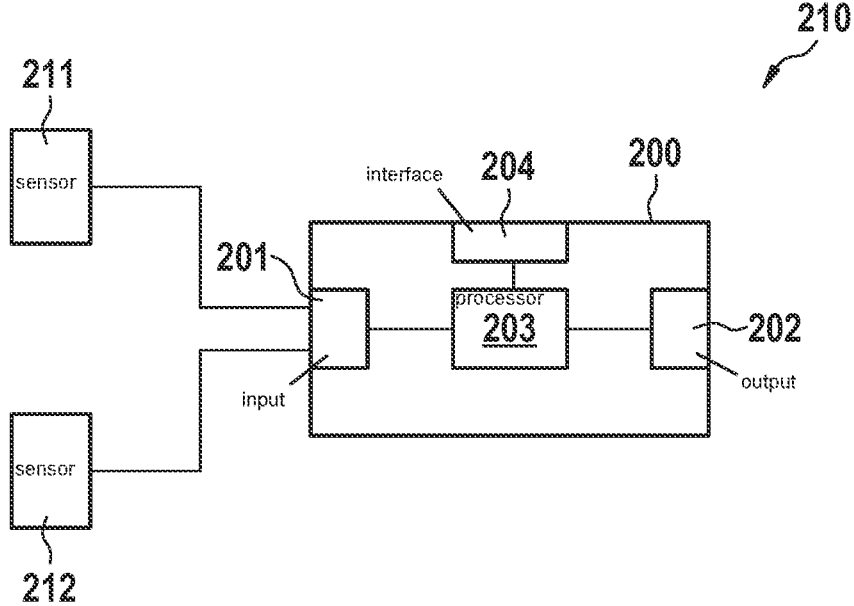
FIG. 6 shows a sensor system according to an example embodiment of the present invention.

FIG. 6 shows a sensor system 210 with a computing unit 200 as explained in connection with FIG. 5, a first sensor 211 and a second sensor 212. A different number of sensors 211, 212 may also be provided. The sensors 211, 212 are designed to convert a physical measured variable into raw sensor data and/or processed sensor data and to output them to the input 201 of the computing unit 200. The first sensor 211 may for example be an acceleration sensor. The second sensor 212 may for example be a gyroscope. The sensors 211, 212 may furthermore also comprise magnetic field sensors, sensors for satellite positioning systems such as for example GPS and/or Galileo, pressure sensors, cameras, radar or lidar sensors. The first sensor 211 and/or the second sensor 212 may here be designed to generate processed sensor data from the raw sensor data. For example, raw sensor data from an acceleration sensor (acceleration data) can be processed to yield speed data by integrating the acceleration data and so determining speeds.

Although the present invention has been described in detail with reference to the preferred exemplary embodiments, the present invention is not restricted to the disclosed examples and other variations thereof may be derived by a person skilled in the art without going beyond the scope of protection of the present invention.

What is claimed is:

1. A method for evaluating sensor data, the method comprising the following steps:

inputting raw sensor data and/or processed sensor data from at least one sensor;

determining measurement data from the raw sensor data and/or the processed sensor data;

correcting the measurement data based on a mathematical model, wherein the measurement data is corrected either when a check of a change in a sensor alignment reveals that the sensor alignment has changed or when a check of an intensity of a sensor movement reveals that an intensity of the sensor movement exceeds a predetermined value, and wherein, on correction, drift of the raw sensor data and/or of the processed sensor data is determined and removed from the measurement data; and outputting the corrected measurement data.

2. The method as recited in claim 1, wherein a speed of movement of the sensor is determined from the raw sensor data and/or the processed sensor data.

3. The method as recited in claim 2, wherein the speed of movement of the sensor is corrected on correction of the measurement data by a speed gradient being set to zero.

4. The method as recited in claim 1, wherein the raw sensor data and/or the processed sensor data are checked as to whether a temporally persistent acceleration of the movement of the sensor is present and the measurement data are corrected when no temporally persistent acceleration of the movement of the sensor is present.

5. A method for evaluating sensor data, the method comprising the following steps:

inputting raw sensor data and/or processed sensor data from at least one sensor;

determining measurement data from the raw sensor data and/or the processed sensor data;

correcting the measurement data based on a mathematical model, wherein, on correction, drift of the raw sensor data and/or of the processed sensor data is determined and removed from the measurement data; and outputting the corrected measurement data, wherein a speed of movement of the sensor is determined from the raw sensor data and/or the processed sensor data, wherein the speed of movement of the sensor is corrected on correction of the measurement data by a speed gradient being set to zero, and wherein the speed gradient is calculated as a quotient of a first cross-correlation from the speed of movement of the sensor and a time, and a second cross-correlation of time with itself.

6. The method as recited in claim 5, wherein the mathematical model includes a probabilistic filter including a Kalman filter.

7. The method as recited in claim 6, wherein the first cross-correlation is a state of the probabilistic filter.

8. A computing unit, comprising:
an input;
an output; and
a processor;
wherein the computing unit is configured to receive raw sensor data and/or processed sensor data via the input, the processor is configured to:
determine measurement data from the raw sensor data and/or the processed sensor data;
correct the measurement data based on a mathematical model, wherein the measurement data is corrected either when a check of a change in a sensor alignment reveals that the sensor alignment has changed or when a check of an intensity of a sensor movement reveals that an intensity of the sensor movement exceeds a predetermined value, and wherein, on correction, drift of the raw sensor data and/or of the processed sensor data is determined and removed from the measurement data; and
wherein the computing unit is configured to output the correct measurement data via the output.

9. A sensor system, comprising:
a sensor configured to convert a physical measured variable into raw sensor data and/or processed sensor data; and
a computing unit, the sensor being configured to output the raw sensor data and/or the processed sensor data to an input of the computing unit, and the computing unit includes:
the input,
an output, and
a processor,
wherein the computing unit is configured to receive raw sensor data and/or processed sensor data via the input, the processor is configured to:
determine measurement data from the raw sensor data and/or the processed sensor data,
correct the measurement data based on a mathematical model, wherein the measurement data is corrected either when a check of a change in a sensor alignment reveals that the sensor alignment has changed or when a check of an intensity of a sensor movement reveals that an intensity of the sensor movement exceeds a predetermined value, and wherein, on correction, drift of the raw sensor data and/or of the processed sensor data is determined and removed from the measurement data, and
wherein the computing unit is configured to output the correct measurement data via the output.

* * * * *